(12) United States Patent
Bailey et al.

(10) Patent No.: US 10,869,405 B1
(45) Date of Patent: Dec. 15, 2020

(54) ROUTING POWER AND DATA CABLES TO INFORMATION HANDLING SYSTEM RACKS IN A DATA CENTER

(71) Applicant: DELL PRODUCTS, L.P., Round Rock, TX (US)

(72) Inventors: Mark M. Bailey, Round Rock, TX (US); Anthony P. Middleton, Cedar Park, TX (US)

(73) Assignee: Dell Products, L.P., Round Rock, TX (US)

(*) Notice: Subject to any disclaimer, the term of this patent is extended or adjusted under 35 U.S.C. 154(b) by 0 days.

(21) Appl. No.: 16/743,867

(22) Filed: Jan. 15, 2020

(51) Int. Cl.
 *G06F 1/16* (2006.01)
 *H05K 5/00* (2006.01)
 *H05K 7/00* (2006.01)
 *H05K 7/14* (2006.01)

(52) U.S. Cl.
 CPC ......... *H05K 7/1491* (2013.01); *H05K 7/1489* (2013.01); *H05K 7/1492* (2013.01)

(58) Field of Classification Search
 CPC ...... H05K 7/14; H05K 7/1489; H05K 7/1491; H05K 7/1492; H05K 7/1488; H05K 7/1487; H05K 7/1485; H05K 7/18; H05K 7/183; H05K 7/186
 See application file for complete search history.

(56) References Cited

U.S. PATENT DOCUMENTS

| | | | | |
|---|---|---|---|---|
| 9,232,678 B2* | 1/2016 | Bailey | ................. | H05K 7/1492 |
| 9,292,057 B2* | 3/2016 | Cox | ..................... | H05K 7/1489 |
| 9,392,720 B1* | 7/2016 | Kim | ..................... | H05K 7/1492 |
| 9,466,964 B1* | 10/2016 | Watson | ................ | H05K 7/1491 |
| 9,535,469 B2* | 1/2017 | Zhang | .................... | G06F 1/189 |
| 9,622,373 B1* | 4/2017 | Sarti | ..................... | H05K 7/1492 |
| 9,723,747 B1* | 8/2017 | Marrs | ................. | H05K 7/1489 |
| 9,750,157 B1* | 8/2017 | Mehta | ................. | H05K 5/0226 |
| 9,769,961 B2* | 9/2017 | Bach | ................. | H05K 7/20736 |
| 9,801,308 B2* | 10/2017 | Teeter | ................. | H05K 7/1491 |
| 9,996,119 B2* | 6/2018 | Leigh | ..................... | G06F 1/183 |
| 10,111,359 B2* | 10/2018 | Zhou | .................... | G11B 33/128 |
| 10,531,588 B2* | 1/2020 | Okkoso | ................ | H05K 7/1489 |

* cited by examiner

*Primary Examiner* — Anthony M Haughton
(74) *Attorney, Agent, or Firm* — Isidore PLLC

(57) ABSTRACT

A data center includes a rack containing a first and second information handling system. A panel having a first opening and a second opening is coupled to a side of the rack. A cable guide is positioned adjacent to the panel. The cable guide encloses a cable passage extending there-through. A first cable extends through the cable passage, through the first opening and terminates in a first connection to the first information handling system. A second cable extends through the cable passage, through the second opening and terminates in a second connection to the second information handling system. The cable guide and the first opening provide a first separate routing path for the first cable to the first information handling system and the cable guide and the second opening provide a second separate routing path for the second cable to the second information handling system.

20 Claims, 9 Drawing Sheets

US 10,869,405 B1

ROUTING POWER AND DATA CABLES TO INFORMATION HANDLING SYSTEM RACKS IN A DATA CENTER

BACKGROUND

1. Technical Field

The present disclosure generally relates to information handling systems and in particular to providing separate cable routing paths for information handling system racks in a data center.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A data center contains data center equipment such as information handling systems, storage, networking, power, and cooling systems. The data center equipment, such as components of the information handling systems, are housed within one or more racks. In a data center, multiple customers may share a common rack. Unfortunately, when data center customers share a common rack, providing secure access to each customer's equipment is complicated by the routing of power and data cables to the common rack.

BRIEF SUMMARY

Disclosed are a rack information handling system (RIHS), a data center, and a method of manufacturing a data center that provides separate, secure cable routing paths for separate compartments of IHSs within IHS racks in a data center.

According to one embodiment, a RIHS includes at least a first rack configured with at least a first compartment for housing one or more information technology (IT) components that require power and data/network connections. A first panel is coupled to a first side of the first rack. The first panel has a first opening adjacent to a vertical location of the first IT component and a second opening adjacent to a next vertical location of the second IT component. A first cable guide is positioned adjacent to the first panel. The first cable guide encloses a first cable passage disposed vertically therein. A first cable extends vertically through a first section of the first cable passage, through the first opening and terminates inside the first compartment, presenting a first power and/or data connection for at least a first IT component. A second cable extends vertically through a second section of the first cable passage, through the second opening and terminates inside one of the first compartment and a separate, second compartment, presenting a second power and/or data connection for at least a second IT component. The second section of the cable passage overlaps at least a portion of the first section. The first cable guide and the first opening provide a first routing path for the first cable to the first IT component. The first cable guide and the second opening provide a second, separate routing path for the second cable to the second IT component. The first and second routing paths are each individual separate routing paths.

According to a next embodiment, a data center includes at least a first rack containing at least a first information handling system and a second information handling system. A first panel is coupled to a first side of the first rack. The first panel has a first opening and a second opening. A first cable guide is positioned adjacent to the first panel. The first cable guide encloses a first cable passage disposed therein. A first cable extends vertically through a first section of the first cable passage, through the first opening and terminates in a first connection to the first information handling system. A second cable extends through the first cable passage, through the second opening and terminates in a second connection to the second information handling system. The first cable guide and the first opening provide a first routing path for the first cable to the first information handling system. The first cable guide and the second opening provide a second, separate routing path for the second cable to the second information handling system. The first and second routing paths are each individual separate routing paths.

According to another embodiment, a method of manufacturing a data center includes installing a first rack within the data center and positioning a first panel adjacent to a first side of the first rack. The first panel has a first opening and a second opening. The method further includes providing a first cable guide enclosing a cable passage extending therethrough, and positioning the first cable guide adjacent to the first panel. The method also includes routing a first cable along a first passage of the first cable guide and through the first opening of the first panel and routing a second cable along the first passage of the first cable guide and through the second opening. The method further includes connecting the first cable to a first information handling system and connecting the second cable to a second information handling system. The first and second information handling systems can be housed in separate compartments. The first cable guide is secured via a locking mechanism to prevent access to the cabling provided to the separate compartments.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
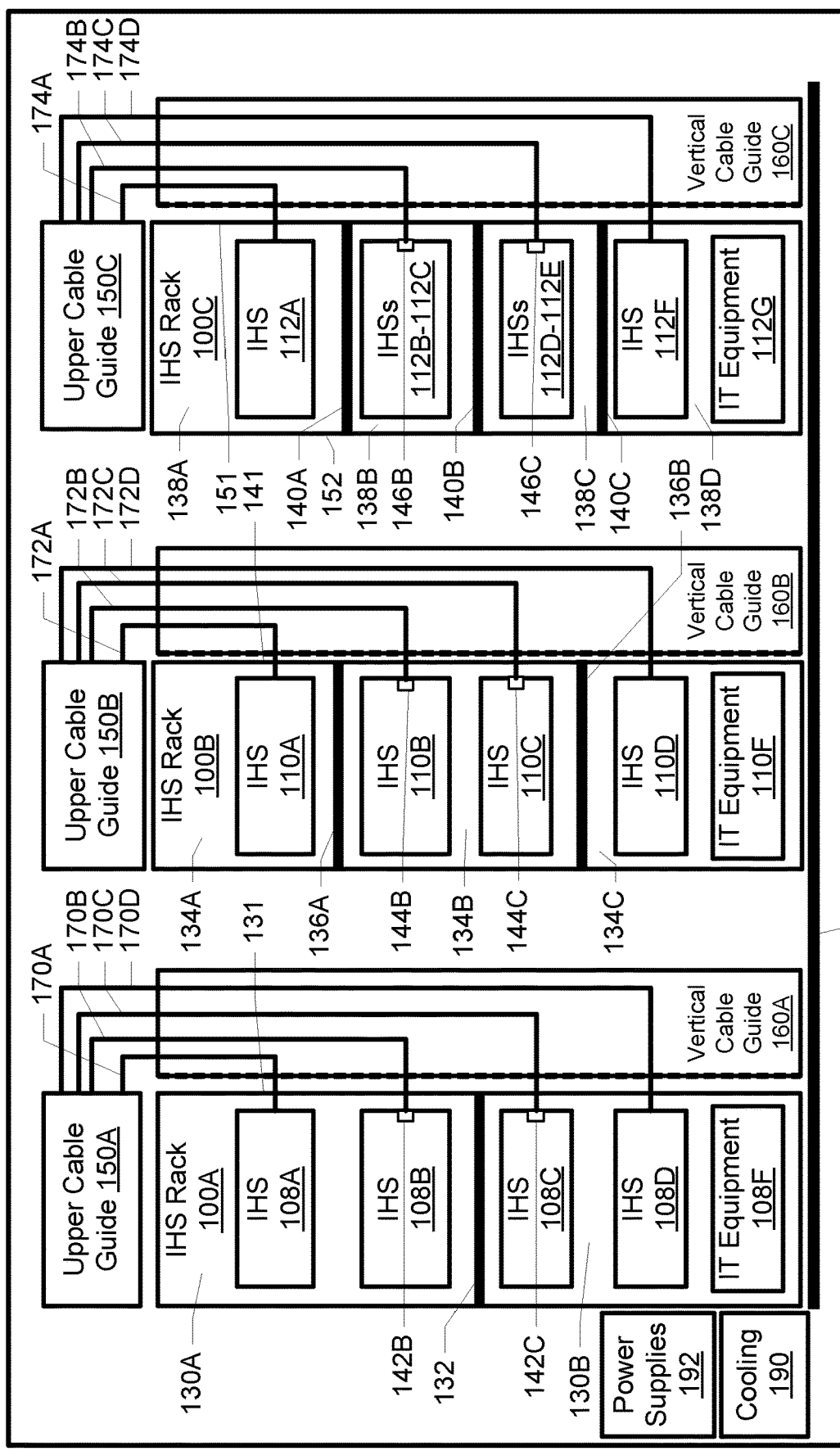
FIG. 1 provides a block diagram representation of an example data center having a plurality of information handling system (IHS) racks or rack information handling systems (RIFTS) and adjoining cable management guides, according to one or more embodiments.

The illustrative embodiments provide a rack information handling system (RIHS), a data center, and a method of manufacturing a data center that provides separate, secure cable routing paths for separate compartments of IHSs within IHS racks in a data center. The RIHS includes at least a first rack configured with at least a first compartment for housing one or more IT components that require power and data/network connections. A first panel is coupled to a first side of the first rack. The first panel has a first opening and a second opening. A first cable guide is positioned adjacent to the first panel. The first cable guide encloses a first cable passage disposed therein. A first cable extends through the first cable passage, through the first opening and terminates inside the first compartment, presenting a first power and/or data connection for the first IT component. A second cable extends through the first cable passage, through the second opening and terminates inside one of the first compartment and a separate, second compartment, presenting a second power and/or data connection for a second IT component. The first cable guide and the first opening provide a first, separate routing path for the first cable to the first IT component. The first cable guide and the second opening provide a second, separate routing path for the second cable to the second IT component. The first cable guide is secured via a locking mechanism to prevent access to the cabling provided therein and to prevent access to the first and second compartments. The first and second compartments can also be secured from unauthorized access via respective locking mechanisms.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized, and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

FIG. 1 illustrates a block diagram representation of an example data center 120, within which one or more of the described features of the various embodiments of the disclosure can be implemented. Data center 120 includes a plurality of information handling systems (IHS) racks 100A-C, which can each house information technology (IT) equipment, such as an IHS or one or more components of an IHS. For purposes of this disclosure, an information handling system, such as IHS 108A, can be housed within IHS racks 100A-C. Example IHS 108A can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The IHS may include random access memory (RAM), one or more processing resources such as a central processing unit (CPU) or hardware or software control logic, ROM, and/or other types of nonvolatile memory. Additional components of the IHS may include one or more disk drives, one or more network ports for communicating with external devices as well as various input and output (I/O) devices, such as a keyboard, a mouse, and a video display. The IHS may also include one or more buses operable to transmit communications between the various hardware components.

Referring specifically to FIG. 1, data center 120 includes RIHS or IHS racks 100A-C located on floor 124. IHS racks 100A-C house/contain various information technology (IT) components including, but not limited to information processing equipment, such as components of IHSs, and other IT and/or Operational Technology (OT) equipment (collectively presented as IT equipment). IHS rack 100A includes IHSs 108A-D and other IT components, presented as IT equipment 108F. IHS rack 100B includes IHSs 110A-D and IT equipment 110F. IHS rack 100C includes IHSs 112A-F and IT equipment 112G.

IHS rack 100A is divided into two separate compartments 130A-B by horizontal partition 132. Compartment 130A can house or contain IHS 108A and IHS 108B. Compartment 130B can house or contain IHS 108C, IHS 108D, and IT equipment 108F. IHS rack 100B is divided into three separate compartments 134A-C by horizontal partitions 136A-C. Compartment 134A can house or contain IHS 110A. Compartment 134B can house or contain IHS 110B and IHS 110C. Compartment 134C can house or contain IHS 110D and IT equipment 110F. IHS rack 100C is divided into four separate compartments 138A-D by horizontal partitions 140A-C. Compartment 138A can house or contain IHS 112A. Compartment 138B can house or contain IHSs 112B-C. Compartment 138C can house or contain IHS 112D-E. Compartment 138D can house or contain IHS 112F and IT equipment 112G.

It is appreciated that the size of the compartments and the number of individual IT components (or IHSs) housed within each compartment can vary. Each compartment has an access door from a front facing side and is bordered on one side by a first side panel 131, 141, 151 of a corresponding rack. Each first side panel 131, 141, 151 can include a plurality of vertically aligned openings 310A-D and 312A-D (see FIG. 3) through which power and data/networking/communication cables can be extended into the respective compartment. In one or more embodiments, the first side panel is divided into multiple first side panels, with the number of side panels provided on each rack being a design choice. With the multiple panel configuration, each side panel is shorter and can be individually attached to the side of the rack.

Each rack is also configured with a second side panel 152 that extends down the opposite side from the cable guide. The second side panel 152 can be perforated for air movement, but does not include any openings sufficiently large for exterior access into the compartment from the second side panel. In one or more embodiments, the horizontal partitions seal a top and bottom of each compartment from physical access from the top and bottom, respectively of the compartment. While not presented as a horizontal partition, per se, the base of each IHS rack 100A-C and top of each IHS rack 100A-C are also configured with an attached panel that likewise prevents access to the bottom IT compartment and the top IT compartment.

Data center 120 further includes upper cable guides 150A-C and vertical cable guides 160A-C. Upper cable guides 150A-D are located above the top of IHS racks 100A-C. Each of vertical cable guides 160A-C is located adjacent to one side of a corresponding one of IHS racks 100A-C. Upper cable guides 150A-C and vertical cable guides 160A-C are configured to support data, network/communication, and power cables to IHSs and IT equipment within IHS racks 100A-C and to other components of data center 120. In the illustration of FIG. 1, a space is shown between vertical cable guide 160A and IHS rack 100B and a space is shown between vertical cable guide 160B and IHS rack 100C to accommodate the placement of reference numbers. In at least one embodiment, these spaces are omitted such that vertical cable guide 160A and IHS rack 100B are adjacent to each other and vertical cable guide 160B and IHS rack 100C are adjacent to each other.

Data and power cables 170A-D are illustrated as combined into a single unit or trunk that includes both cables; However, it is appreciated that the data cables and power cables are separate and that each presented combined cable, e.g., data and power cable 170A, can be a single pair or multiple separate power cables and data cables. Data and power cables 170A are supported by and routed across upper cable guide 150A, down through a section of vertical cable guide 160A, then laterally across through the opening in side panel 131 of IHS rack 100A. Data and power cables 170B are supported by and routed across upper cable guide 150A, down through a section of vertical cable guide 160A, then laterally across through the opening in side panel 131 of IHS rack 100A. Data and power cables 170B terminate with one or more connectors or connections 142B to IHS 108B. Data and power cables 170C are supported by and routed across upper cable guide 150A, down through a section of vertical cable guide 160A and then laterally across through the opening in side panel 131 of IHS rack 100A. Data and power cables 170C terminate with one or more connectors or connections 142C to IHS 108C. Data and power cables 170D are supported by and routed across upper cable guide 150A, down through a section of vertical cable guide 160A, then laterally across through the opening in side panel 131 of IHS rack 100A.

Data and power cables 172A are supported by and routed across upper cable guide 150B, down through a section of vertical cable guide 160B, then laterally across through the opening in side panel 141 of IHS rack 100B. Data and power cables 172B are supported by and routed across upper cable guide 150B, down through a section of vertical cable guide 160B and then laterally across through the opening in side panel 141 of IHS rack 100B. Data and power cables 172B terminate with one or more connectors or connections 144B to IHS 110B. Data and power cables 172C are supported by and routed across upper cable guide 150B, down through a section of vertical cable guide 160B and then laterally across through the opening in side panel 141 of IHS rack 100B. Data and power cables 172C terminate with one or more connectors or connections 144C to IHS 110C. Data and power cables 172D are supported by and routed across upper cable guide 150B, down through a section of vertical cable guide 160B, then laterally across through the opening in side panel 141 of IHS rack 100B.

Data and power cables 174A are supported by and routed across upper cable guide 150C, down through a section of vertical cable guide 160C and then laterally across through the opening in side panel 151 of IHS rack 100C. Data and power cables 174B are supported by and routed across upper cable guide 150C, down through a section of vertical cable guide 160C and then laterally across through the opening in side panel 151 of IHS rack 100C. Data and power cables 174B terminate with one or more connectors or connections 146B to IHS 112B-C. Data and power cables 174C are supported by and routed through upper cable guide 150C, down through a section of vertical cable guide 160C and then laterally across through the opening in side panel 151 of IHS rack 100C. Data and power cables 174C terminate with one or more connectors or connections 146C to IHS 112D-E. Each IHS 108A-D, 110A-D and 112A-F has a separate routing path for data and power cables through vertical cable guides 160A-C to separate compartments within data center 120. Data and power cables 174D are supported by and routed across upper cable guide 150C, down through a section of vertical cable guide 160C, then laterally across through the opening in side panel 151 of IHS rack 100C.

Data center 120 further comprises one or more cooling devices 190 and power supplies 192. Cooling devices 190, such as one or more fans or air handling units (AHUs), can cool IHS 108A-D, 110A-D, 112A-F and IT equipment 108F, 110F and 112G housed within IHS racks 100A-C during operation of data center 120. Power supplies 192 can supply regulated power to IHS 108A-D, 110A-D, 112A-F and IT equipment 108F, 110F and 112G of data center 120.

Figure 2A:
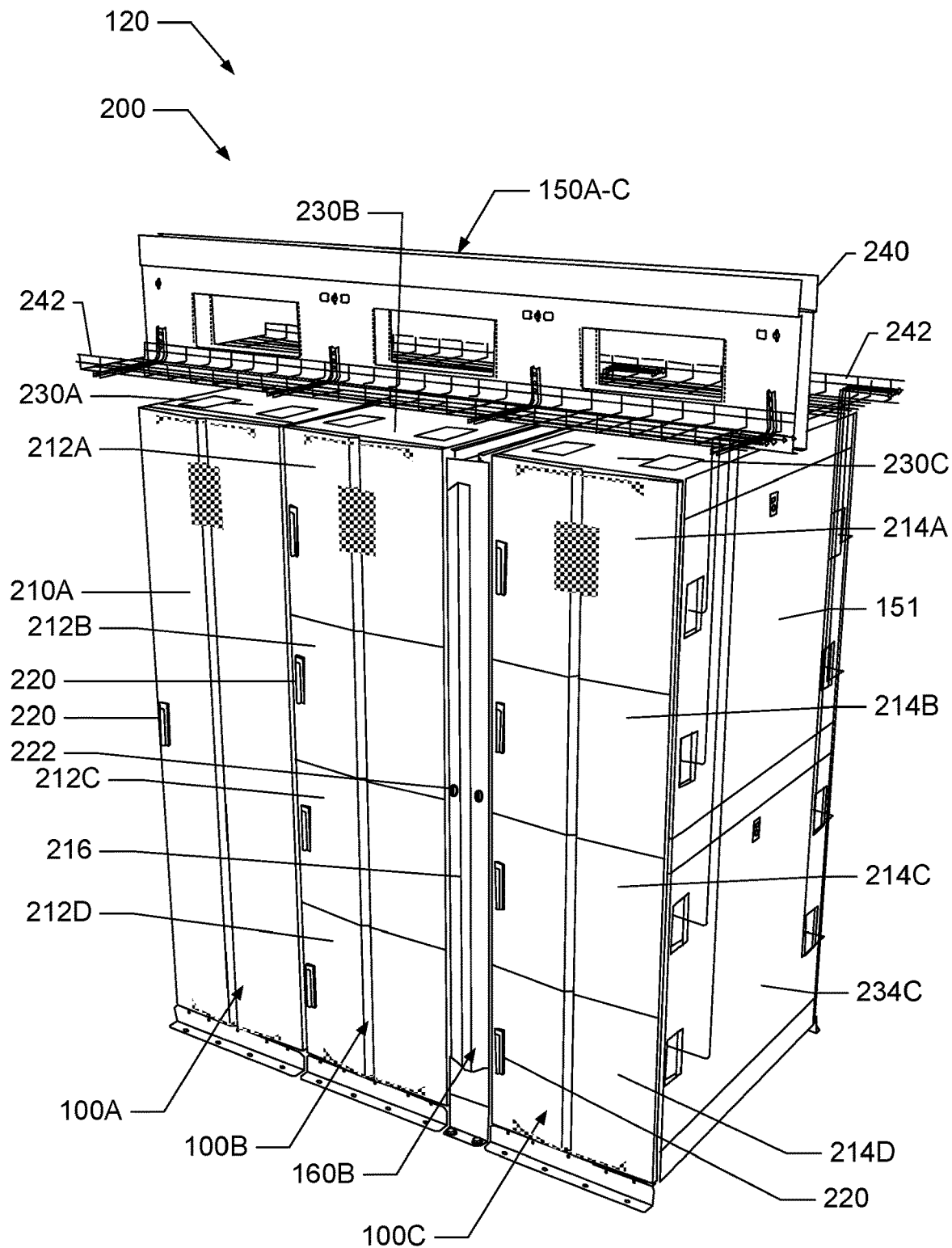
FIG. 2A illustrates a perspective view of several compartmentalized IHS racks with adjacent vertical cable guides, according to one or more embodiments.

In the discussion of the following figures, the description of each figure can include general reference to the specific components illustrated within the preceding figures. Turning to FIG. 2A, several IHS racks are shown positioned adjacent to each other. As presented in the figure, data center 120 comprises a group of racks 200, including IHS racks 100A-C, with adjacent vertical cable guide 160B and upper cable guides 150A-C. IHS rack 100A is positioned adjacent to IHS rack 100B. Vertical cable guide 160B is positioned between and adjacent to IHS rack 100B and IHS rack 100C. Upper cable guides 150A-C are positioned above respective IHS racks 100A-C. In at least one embodiment, upper cable guides 150A-C are attached or suspended from a ceiling of data center 120. In another embodiment, upper cable guides 150A-C can be mounted to the top of respective IHS racks 100A-C. In one or more embodiments, a single upper cable guide 150 can be presented extending across the entire group of IHS racks 100A-C.

IHS rack 100A has a single access door 210A mounted to the front of IHS rack 100A. IHS rack 100B has four access doors 212A-D mounted to the front of IHS rack 100B. IHS rack 100C has four access doors 214A-D mounted to the front of IHS rack 100B. One or more access doors 216 are also mounted to the front of vertical cable guide 160C. Lock mechanism 220 is mounted to each of access doors 210A, 212A-D and 214A-D. Lock mechanism 222 is mounted to access door(s) 216.

Access door 210A and lock mechanism 220 allow selective access to at least a portion (i.e., a compartment) of the interior of IHS rack 100A. Each of access doors 212A-D and lock mechanism 220 provide selective access to at least a portion (i.e., a compartment) of the interior of IHS rack 100B. Each of access doors 214A-D and lock mechanism 220 provide selective access to at least a portion (i.e., a compartment) of the interior of IHS rack 100C. Access door(s) 216 and lock mechanism 222 provide selective access to the interior of vertical cable guide 160C.

Each of IHS racks 100A-C has attached respective top panel 230A-C and respective first side panels 131, 141, 151 (see FIG. 1) that encloses at least a portion of IHS racks 100A-C. Upper cable guides 150A-C include support assembly 240 and cable trays 242. In at least one embodiment, support assembly 240 is attached or suspended from a ceiling of data center 120. One cable tray 242 is mounted to the front of support assembly 240 and another cable tray 242 is mounted to the rear of support assembly 240. Cable trays 242 can support, retain and route various power and data cables to IHS racks 100A-C.

Figure 2B:
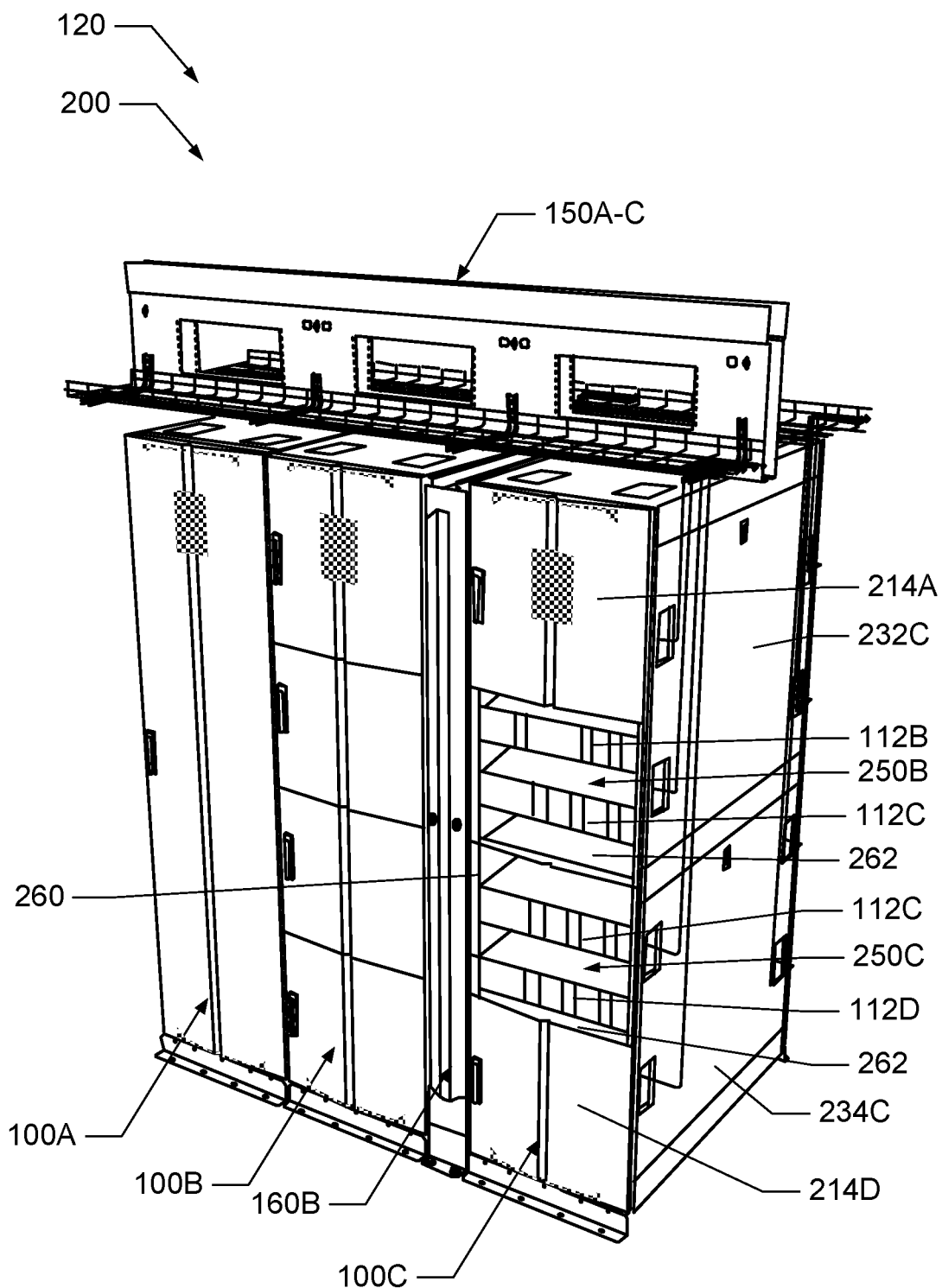
FIG. 2B illustrates the compartmentalized IHS racks and vertical cable guides of FIG. 2A with a pair of rack compartment doors removed to reveal a pair of compartments each containing at least one IHS, according to one or more embodiments.

With reference to FIG. 2B, group of racks 200 is shown with access doors 214B and 214C of two compartments 250B, 250C within IHS rack 100C removed. IHS rack 100C includes frame 260 and horizontal partitions 262. Frame 260 supports the components of IHS rack 100C. Horizontal partitions 262 separate IHS rack 100C into several individual compartments, including compartment 250B and compartment 250C. Access door 214B (FIG. 2A) provides access to compartment 250B and access door 214C (FIG. 2A) provides access to compartment 250C. Each compartment can have a respective IHS(s), IHS components and IT equipment mounted therein. Compartment 250B contains IHSs 112B and 112C and compartment 250C contains IHSs 112D and 112E. Examples of IHS components and IT equipment that can be housed within and IHS rack include, but are not limited to, computers, computing nodes, servers, server blades, input/output (I/O) modules, storage devices, network cards, routers and network switches.

Figure 3:
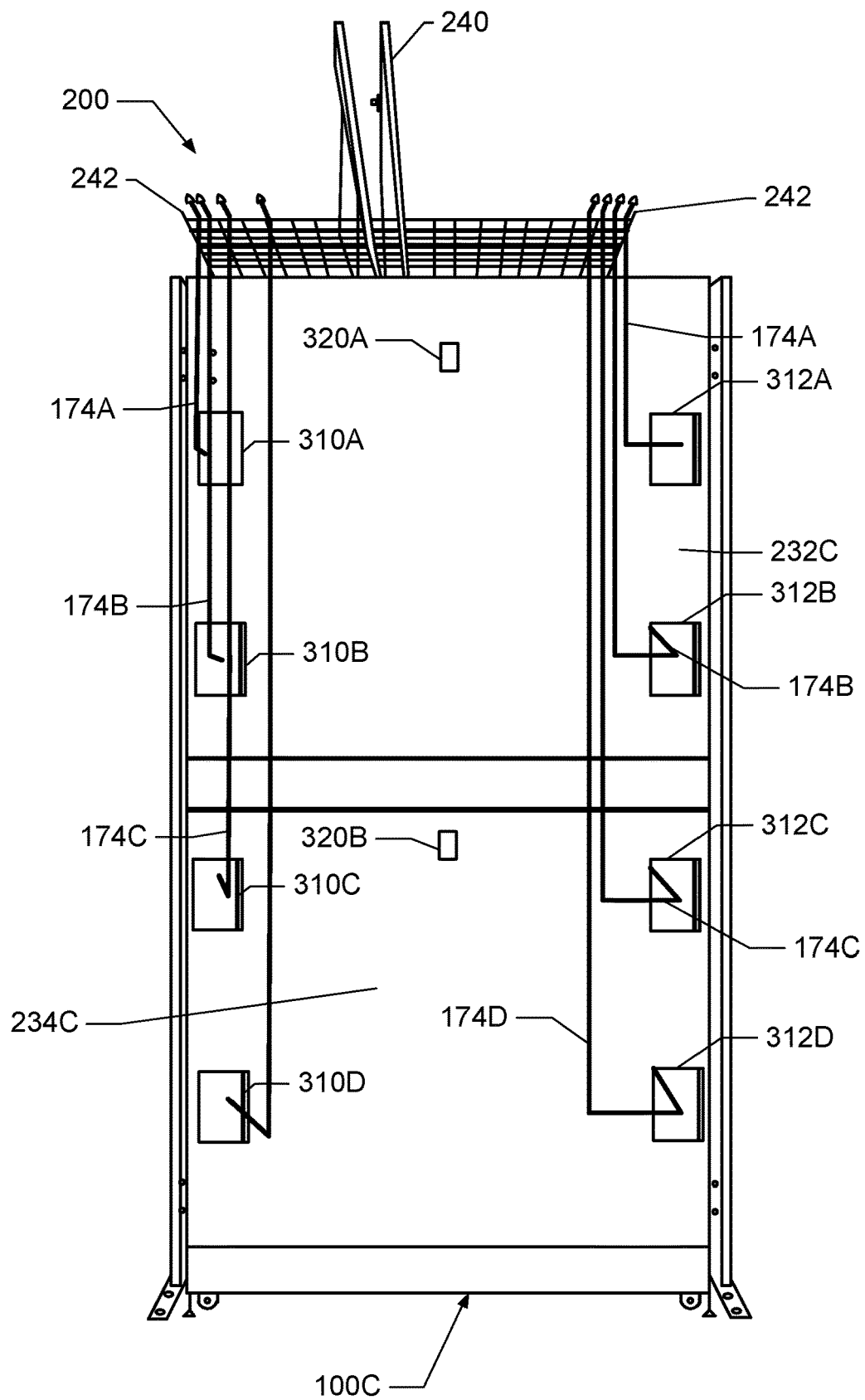
FIG. 3 illustrates a side view of the IHS racks with the openings presented in the side panel for routing cables received from the top-of-rack cable management guide of FIG. 2A, according to one or more embodiments.

Turning to FIG. 3, a right side view of IHS rack 100C is shown. IHS rack 100C includes two side panels 232C and 234C that are mounted to the right side of IHS rack 100C. Side panel 232C is top mounted and includes openings 310A, 310B, 312A and 312B and lock mechanism 320A. Side panel 234C is bottom mounted and includes openings 310C, 310D, 312C and 312D and lock mechanism 320B. In at least one embodiment, side panels 232C and/or 234C can be removed from IHS rack 100C after unlocking a corresponding one of lock mechanism 320A and/or lock mechanism 320B.

Data and power cables 174A are routed through at least one of opening 310A and/or opening 312A and terminate with one or more connectors or connections to IHS 112A. Data and power cables 174B are routed through at least one of opening 310B and/or opening 312B and terminate with one or more connectors or connections 146B (FIG. 1) to IHS 112B and 112C. Data and power cables 174C are routed through at least one of opening 310C and/or opening 312C and terminate with one or more connectors or connections 146C (FIG. 1) to IHS 112D and 112E. Data and power cables 174D are routed through at least one of opening 310D and/or opening 312D and terminate with one or more connectors or connections to IHS 112F. In one embodiment, data cables are routed to a front opening and power cables are routed to the back opening in side panels 232C, 234C to align with the location of a power connector and a data port on the associated IHS or IT component housed within the compartment.

Figure 4A:
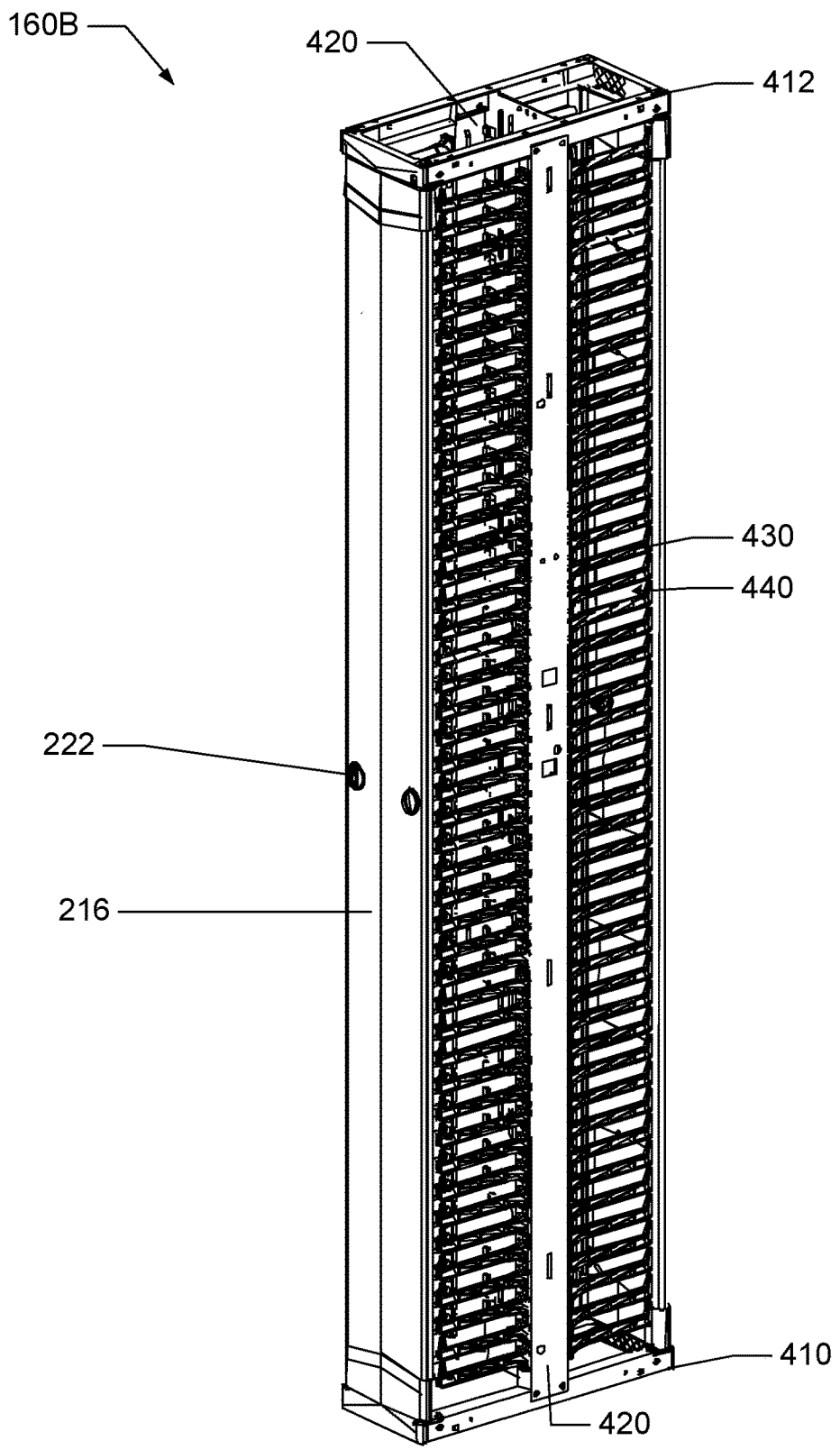
FIG. 4A illustrates a perspective view of a vertical cable guide, according to one or more embodiments.
Figure 4B:
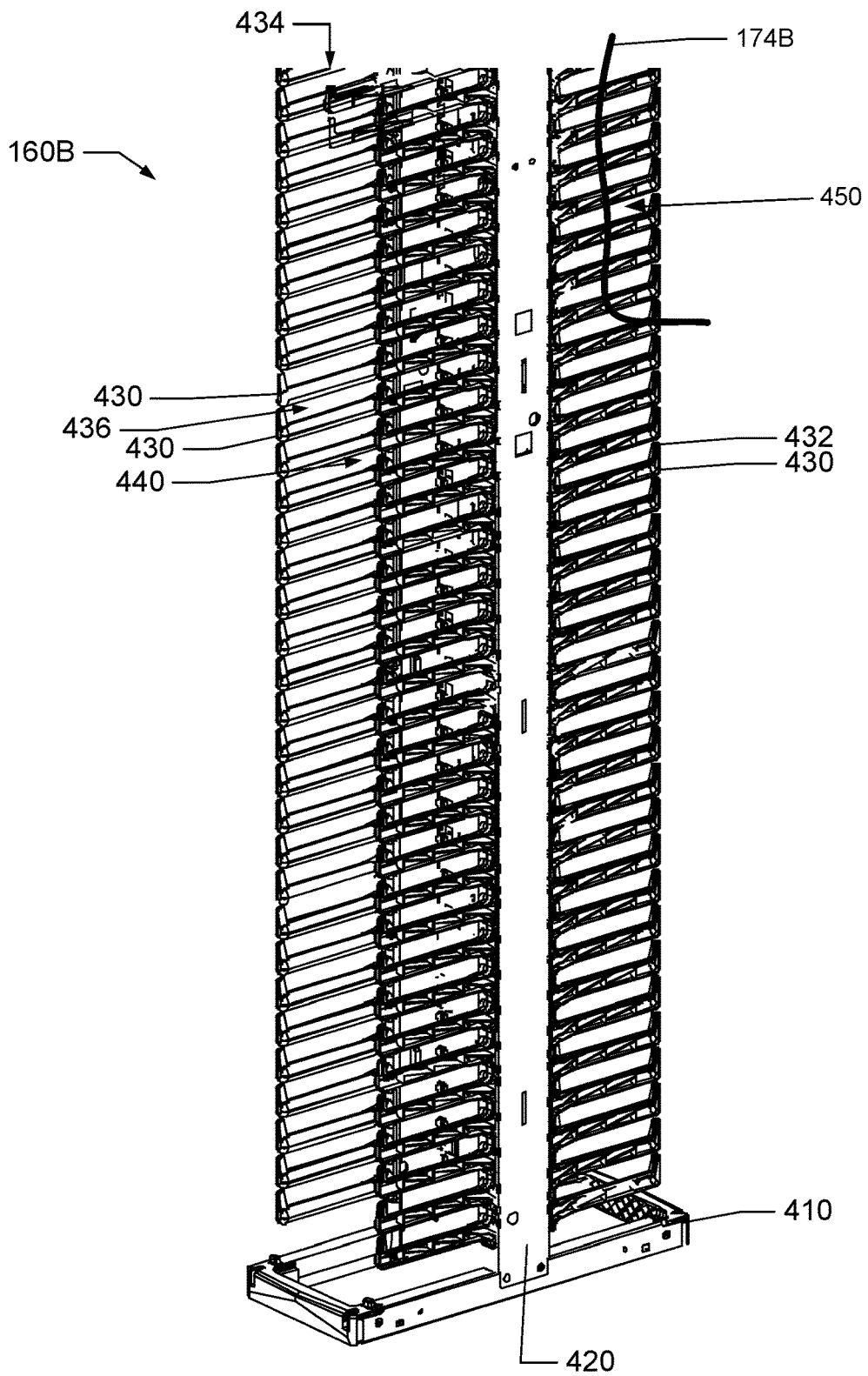
FIG. 4B illustrates an enlarged perspective view of a vertical cable guide frame without doors and exterior side walls, according to one or more embodiments.

With reference to FIGS. 4A and 4B, details of vertical cable guide 160B are shown. Vertical cable guide 160B includes base member 410 and top member 412 (FIG. 4A). A pair of columns 420 is mounted to base member 410 and top member 412 and extend between base member 410 and top member 412. Columns 420 are generally perpendicular to base 410 and top member 412. Doors 216 (FIG. 4A) are mounted to base member 410 and top member 412.

Vertical cable guide 160B further includes generally horizontal bars 430 that extend perpendicularly away from each side of columns 420 and are arranged in opposed vertical rows 434 (FIG. 4B). Each bar 430 has an upwardly pointed hook end 432 (FIG. 4B). Cable passages 440 are defined between the rows of bars 430. Slots 436 (FIG. 4B) are defined between pairs of adjacent bars 430. Power and data cables such as power and data cables 174B (FIG. 4B) can be routed along a cable routing path 450 (FIG. 4B) that at least partially comprises cable passage 440 and a slot 436. Power and data cables 174B are at least partially supported by one of bars 430 as they extend through slot 436.

Figure 5:
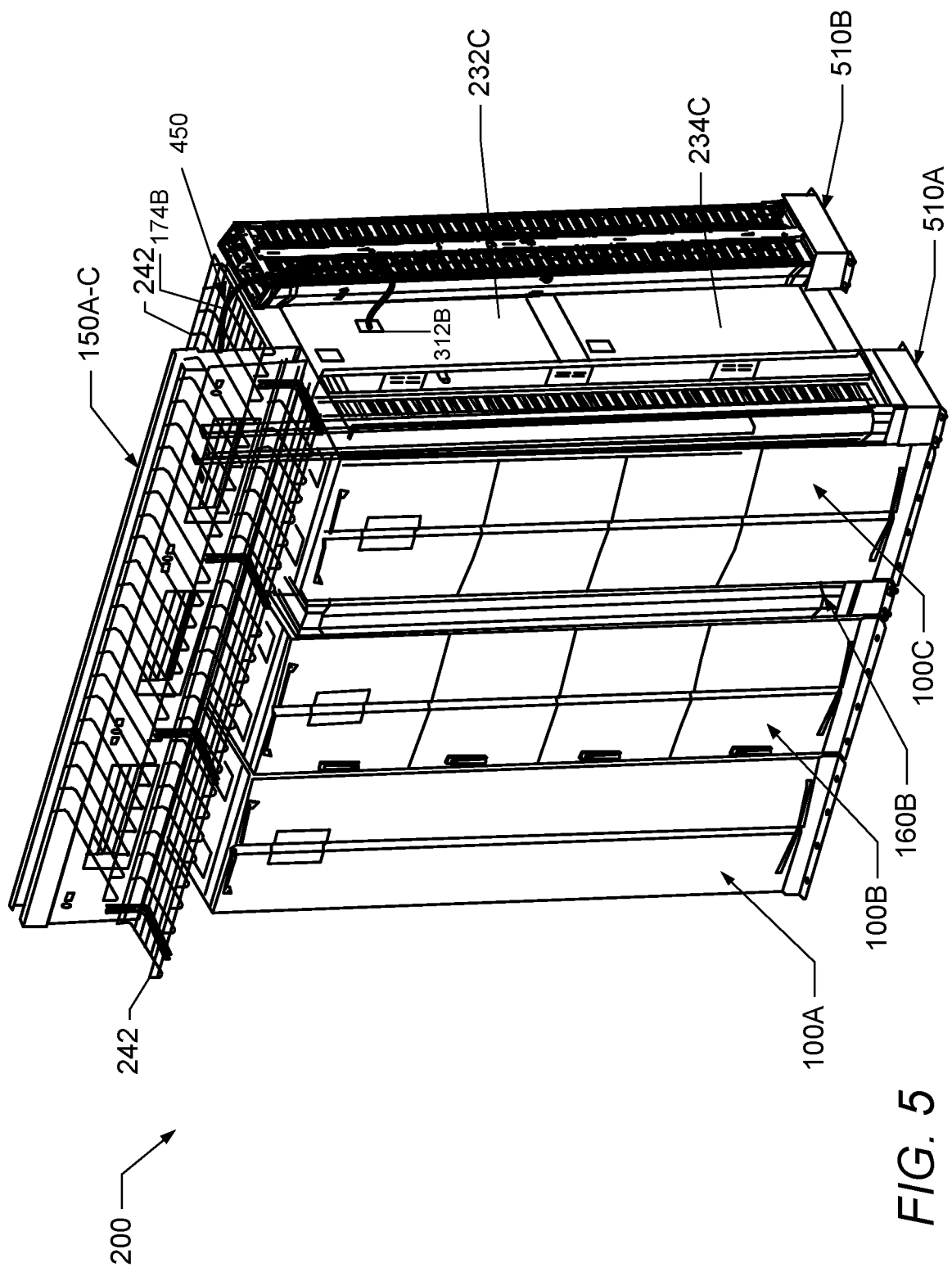
FIG. 5 illustrates a perspective view of several IHS racks with adjacent vertical cable guides, according to one or more embodiments.

Referring to FIG. 5, group of racks 200 is shown with the addition of vertical cable guides 510A and 510B adjacent to side panels 232C and 234C on the side of IHS rack 100C. Vertical cable guide 510A is positioned toward the front of IHS rack 100C and vertical cable guide 510B is positioned toward the rear of IHS rack 100C. Power and data cable such as power and data cables 174B can be routed along cable routing path 450 and through a respective front or rear opening in side panel(s) 232C and/or 234C.

Cable routing path 450 includes power and data cables 174B being supported by and routed along cable tray 242, through cable passage 440, through slot 436, through opening 312B, and terminating with a connection 146B (FIG. 1) to IHS 112B (FIG. 1).

Figure 6:
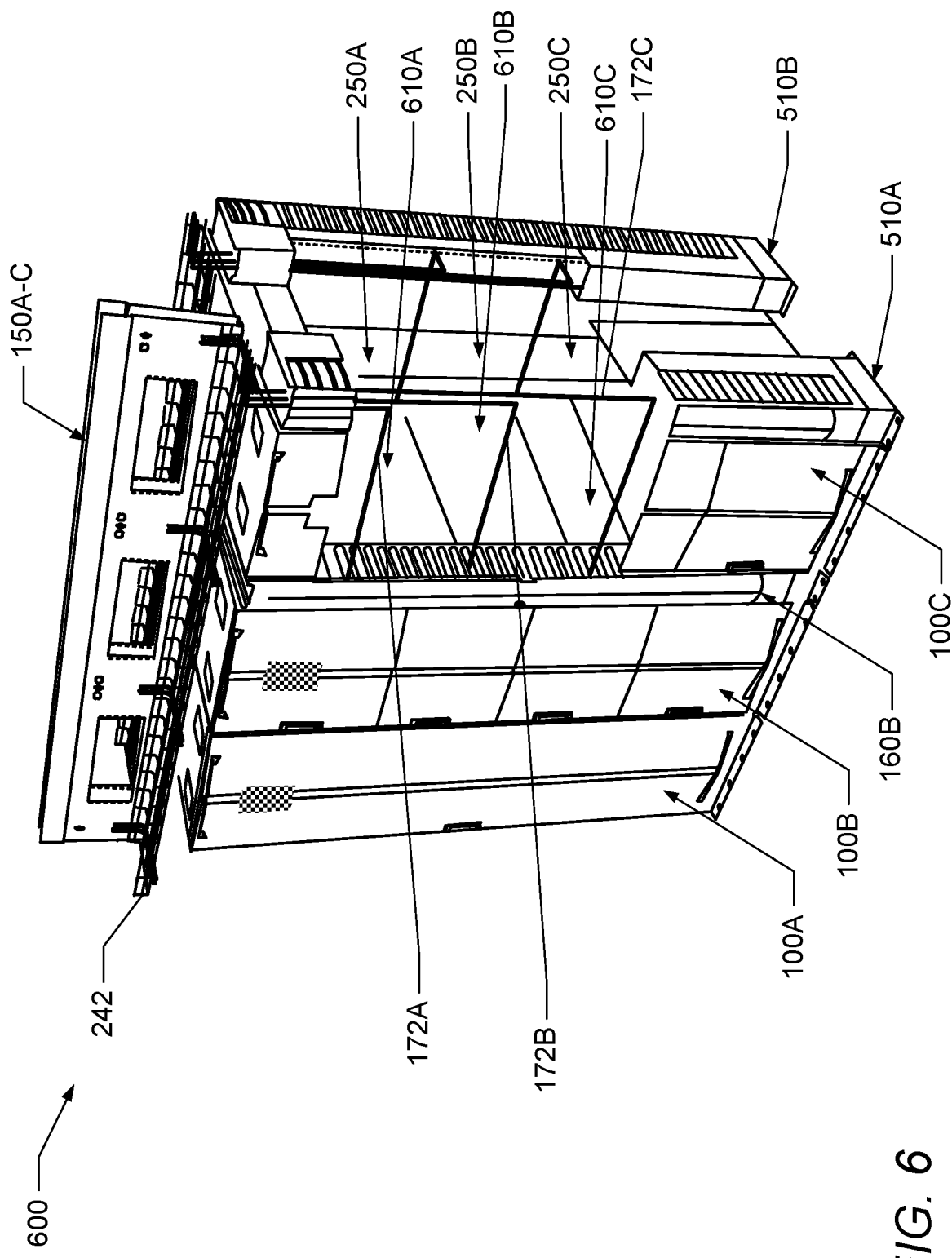
FIG. 6 illustrates a cutaway view of an alternative embodiment of IHS racks with adjacent vertical cable guides, according to one or more embodiments.

FIG. 6 illustrates an alternative embodiment of IHS racks and vertical cable guides. Group of racks 600 includes IHS racks 100A-C, vertical cable guides 160B, 510A, 510B and upper cable guides 150A-C. IHS rack 100C includes compartments 250A, 250B and 250C.

In FIG. 6, alternative routing paths are shown for power and data cables 172A-C. The description is presented with reference to FIGS. 1 and 4B. Cable routing path 610A includes power and data cables 172A being supported by and routed along cable tray 242, through cable passage 440 (FIG. 4B) of vertical cable guide 510A, through slot 436 (FIG. 4B) of vertical cable guide 510A, across compartment 250A, through slot 436 of second vertical cable guide 160B, through second opening 310A (FIG. 3) in IHS rack 100B and terminating with a connection to IHS 110A (FIG. 1).

Similarly, cable routing path 610B includes power and data cables 172B being supported by and routed along cable tray 242, through cable passage 440 (FIG. 4B) of vertical cable guide 510A, through slot 436 (FIG. 4B) of vertical cable guide 510A, across compartment 250B, through slot 436 of vertical cable guide 160B through opening 310B (FIG. 3) in IHS rack 100B and terminating with a connection 144B to IHS 110B (FIG. 1).

Cable routing path 610C includes power and data cables 172C being supported by and routed along cable tray 242, through cable passage 440 (FIG. 4B) of vertical cable guide 510A, through slot 436 (FIG. 4B) of vertical cable guide 510A, across compartment 250C, through slot 436 of vertical cable guide 160B through opening 310B (FIG. 3) in IHS rack 100B and terminating with a connection 144C to IHS 110D and/or IHS 110E (FIG. 1). In the configuration of FIG. 6, power and data cables are run across adjacent compartments in multiple racks, where the racks are installed adjacent to each other with an intermediary cable management guide disposed between the pair of adjacent racks.

Figure 7:
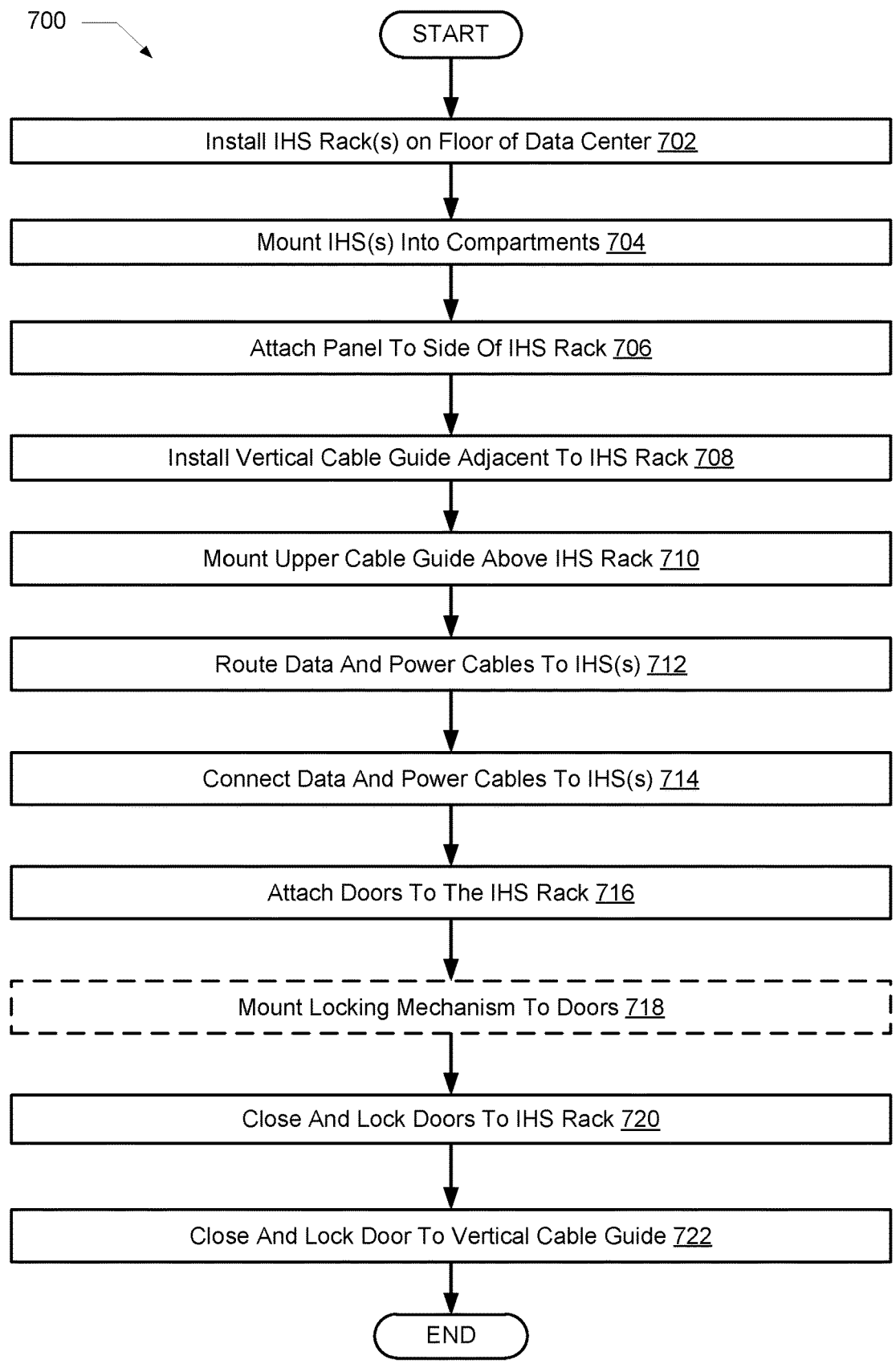
FIG. 7 is a flow chart illustrating an example method of assembling a data center with IHS racks and vertical cable guides to support separate cable routing paths for one or more IHSs, according to one or more embodiments.

FIG. 7 illustrates a flowchart of an exemplary method 700 for manufacturing and/or assembling at least a portion of data center 120 with features of the vertical cable guide that is presented in the preceding figures. The description of the method is provided with general reference to the specific components illustrated within the preceding FIGS. 1-6. In one embodiment, method 700 can be implemented using automated assembly equipment or machine that is at least partially controlled by a controller or IHS. With specific reference to FIG. 7, method 700 begins at the start block and proceeds to block 702 where at least one rack having one or more compartments (i.e., IHS rack 100C) is installed on floor 124 within data center 120. IHS 112B is mounted in compartment 250B of rack and IHS 112C is mounted in compartment 250C of rack (block 704). Side panels 232C and 234C are attached to at least one side of IHS rack 100C (block 706). Panel 232C has an opening 310B and panel 234C has an opening 310C. Vertical cable guide 510A is installed adjacent to IHS rack 100C (block 708). Upper cable guide 150C is mounted above IHS rack 100C (block 710).

As provided at block 712, data and power cables 174B are routed along tray 242 of upper cable guide 150C, down into cable passage 440 of vertical cable guide 510A, and through separate opening 310B to IHS 112B. Also, data and power cables 174C are routed along tray 242 of upper cable guide 150C, down passage 440 of vertical cable guide 510A and through separate opening 310C to IHS 112C (block 712). Data and power cables 174B are connected to connector 146B of IHS 112B, 122C, and data and power cables 174C are connected to connector 146C of IHS 112C (block 714).

Access doors 214B and 214C are attached to front of compartments of IHS rack 100C (block 716). Locking mechanisms 220 are provided for and/or mounted to access doors 214B and 214C (block 718). Access doors 214B and 214C are closed and locked (block 720) and doors 216 of vertical cable guide 510A is closed and locked (block 722). Method 700 then concludes at the end block.

In the above described flow chart, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A rack information handling system comprising:
    at least a first rack configured with at least a first compartment for housing one or more IT components that require power and data/network connections;
    a first panel coupled to a first side of the at least first rack, the first panel having a first opening and a second opening;
    a first cable guide positioned adjacent to the first panel, the first cable guide enclosing a first cable passage disposed therein;
    a first cable extending through the first cable passage, through the first opening and terminating inside the first compartment, presenting a first power or data connection for at least a first IT component; and
    a second cable extending through the first cable passage, through the second opening and terminating inside one of the first compartment and a second, separate compartment, presenting a second power or data connection for at least a second IT component;
    the first cable guide and the first opening providing a first separate routing path for the first cable to the first IT component and the first cable guide and the second opening provide a second separate routing path for the second cable to the second IT component.

2. The rack information handling system of claim 1, further comprising:
    a first door moveably coupled to the at least first rack, the first door allowing access to the first compartment;
    a second door moveably coupled to the at least first rack, the second door allowing access to the second compartment; and
    a locking mechanism attached to a door of the cable guide to lock the cable guide, the door and locking mechanism preventing access to the first and second cables provided within the cable passage and preventing access to the first and second compartments from the first and second openings in the side panel.

3. The rack information handling system of claim 2, further comprising:
    a first locking mechanism mounted to the first door, the first locking mechanism configured to allow selective access to the first compartment; and
    a second locking mechanism mounted to the second door, the second locking mechanism configured to allow selective access to the second compartment;
    wherein the first and second compartments are secured from unauthorized access via respective first and second locking mechanisms.

4. The rack information handling system of claim 1, further comprising:
at least one cable tray adjacent to the at least one first rack, the cable tray configured to hold the first cable and the second cable.

5. The rack information handling system of claim 1, further comprising:
a third and a fourth opening located in the first panel;
a second cable guide positioned adjacent to the first panel, the second cable guide having a second cable passage disposed therein;
a third cable extending through the second cable passage, through the third opening and terminating in a third connection to the at least first IT component; and
a fourth cable extending through the second cable passage, through the fourth opening and terminating in a fourth connection to the at least second IT component.

6. The rack information handling system of claim 5, wherein the first and second cables are data cables and the third and fourth cables are power cables.

7. The rack information handling system of claim 1, wherein the first cable guide further comprises:
a first column;
a second column spaced apart from the first column; and
a plurality of bars extending from first column and the second column, the passage defined between the first column, the second column and the plurality of bars.

8. The rack information handling system of claim 1, further comprising:
at least one second rack, the at least one first rack and the at least one second rack adjacent to each other and forming a group of adjacent racks, the at least one second rack containing a third IT component disposed in a third compartment and a fourth IT component disposed within a fourth compartment, each of the at least one first rack and the at least one second rack having respective cable management subsystems.

9. A data center comprising:
at least a first rack containing at least a first information handling system and at least a second information handling system;
a first panel coupled to a first side of the at least first rack, the first panel having a first opening and a second opening;
a first cable guide positioned adjacent to the first panel, the first cable guide having a first cable passage disposed therein;
a first cable extending through the first cable passage, through the first opening and terminating in a first connection to the at least first information handling system;
a second cable extending through the first cable passage, through the second opening and terminating in a second connection to the at least second information handling system; and
the first cable guide and the first opening provide a first separate routing path for the first cable to the at least first information handling system and the first cable guide and the second opening provide a second separate routing path for the second cable to the at least second information handling system.

10. The data center of claim 9, further comprising:
a first compartment disposed within the at least first rack, the first compartment containing the at least first information handling system;
a first door moveably coupled to the at least first rack, the first door allowing access to the first compartment;
a second compartment disposed within the at least first rack, the second compartment containing the at least second information handling system; and
a second door moveably coupled to the at least first rack, the second door allowing access to the second compartment.

11. The data center of claim 10, further comprising:
a first locking mechanism mounted to the first door, the first locking mechanism configured to allow selective access to the first compartment; and
a second locking mechanism mounted to the second door, the second locking mechanism configured to allow selective access to the second compartment.

12. The data center of claim 9, further comprising:
at least one cable tray adjacent to the at least one first rack, the cable tray configured to hold the first cable and the second cable.

13. The data center of claim 9, further comprising:
a third and a fourth opening located in the first panel;
a second cable guide positioned adjacent to the first panel, the second cable guide having a second cable passage disposed therein;
a third cable extending through the second cable passage, through the third opening and terminating in a third connection to the at least first information handling system; and
a fourth cable extending through the second cable passage, through the fourth opening and terminating in a fourth connection to the at least second information handling system.

14. The data center of claim 9, wherein the first and second cables are data cables and the third and fourth cables are power cables.

15. The data center of claim 9, wherein the first cable guide further comprises:
a first column;
a second column spaced apart from the first column; and
a plurality of bars extending from the first column and the second column, the passage defined between the first column, the second column and the plurality of bars.

16. The data center of claim 9, further comprising:
at least one second rack, the at least one first rack and the at least one second rack adjacent to each other and forming a group of adjacent racks, the at least one second rack containing a third information handling system disposed in a third compartment and a fourth information handling system disposed within a fourth compartment, each of the at least one first rack and the at least one second rack having respective cable management subsystems.

17. A method of manufacturing a rack information handling system, the method comprising:
providing a first rack;
positioning a first panel adjacent to a first side of the first rack, the first panel having a first opening and a second opening;
providing a first cable guide enclosing a cable channel extending there-through;
positioning the first cable guide adjacent to the first panel;
routing a first cable along a first passage of the first cable guide and through the first opening of the first panel;
routing a second cable along the first passage of the first cable guide and through the second opening;
connecting the first cable to a first information handling system; and
connecting the second cable to a second information handling system.

18. The method of claim 17, wherein the first panel has a third opening and a fourth opening, the method further comprising:
- positioning a second cable guide adjacent to the first panel;
- routing a third cable along a second passage of the second cable guide and through the third opening in the first panel;
- routing a fourth cable along the second passage of the second cable guide and through the fourth opening;
- connecting the third cable to the first information handling system; and
- connecting the fourth cable to the second information handling system.

19. The method of claim 17, further comprising:
- attaching a first door to the first rack, the first door allowing access to the first compartment within the first rack;
- attaching a second door to the first rack, the second door allowing access to a second compartment within the first rack.

20. The method of claim 19, further comprising:
- attaching a first locking mechanism to the first door; and
- attaching a second locking mechanism to the second door.

* * * * *